United States Patent [19]

Risberg

[11] Patent Number: 4,623,910
[45] Date of Patent: Nov. 18, 1986

[54] SEMICONDUCTOR DEVICE

[76] Inventor: Robert L. Risberg, 1810 S. Calhoun Rd., New Berlin, Wis. 53151

[21] Appl. No.: 422,920

[22] Filed: Sep. 24, 1982

[51] Int. Cl.[4] .......................................... H01L 29/74
[52] U.S. Cl. ........................................ 357/38; 357/43; 357/40; 357/44
[58] Field of Search ................... 357/37, 38, 39, 40, 357/44, 43, 86; 307/570, 573, 252 C

[56] References Cited

U.S. PATENT DOCUMENTS

| | | | |
|---|---|---|---|
| 3,261,985 | 7/1966 | Somos | 357/40 |
| 3,391,310 | 7/1968 | Gentry | 357/39 |
| 3,401,320 | 9/1968 | Weinstein | 357/38 |
| 3,693,054 | 9/1972 | Anderson | 357/38 |
| 3,972,014 | 7/1976 | Hutson | 357/39 |
| 3,979,766 | 9/1976 | Tsuyuki | 357/37 |
| 3,996,601 | 12/1976 | Hutson | 357/39 |
| 4,011,579 | 3/1977 | Hutson | 357/37 |
| 4,032,958 | 6/1977 | Yagi | 357/37 |
| 4,053,921 | 10/1977 | Jaecklin et al. | 357/39 |
| 4,054,893 | 10/1977 | Hutson | 357/15 |
| 4,163,241 | 7/1979 | Hutson | 357/38 |
| 4,190,853 | 2/1980 | Hutson | 357/39 |
| 4,214,255 | 7/1980 | Neilson | 357/39 |
| 4,278,476 | 7/1981 | Bartko | 148/1.5 |
| 4,286,279 | 8/1981 | Hutson | 357/39 |
| 4,291,325 | 9/1981 | Sueoka | 357/38 |
| 4,398,205 | 8/1983 | Spellman et al. | 357/38 |

FOREIGN PATENT DOCUMENTS

| | | | |
|---|---|---|---|
| 2705990 | 8/1978 | Fed. Rep. of Germany | 357/86 |
| 2835076 | 3/1980 | Fed. Rep. of Germany | 357/38 |
| 52-02287 | 1/1977 | Japan | 357/38 G |
| 52-35586 | 3/1977 | Japan | 357/38 T |

OTHER PUBLICATIONS

IBM Technical Disclosure Bulletin, vol. 20, #6, 11/77, "MOS Gate Turn Off Lateral SCR" by Perner.

Primary Examiner—Andrew J. James
Assistant Examiner—Mark Prenty
Attorney, Agent, or Firm—Sughrue, Mion, Zinn, Macpeak, and Seas

[57] ABSTRACT

A semiconductor device is manufactured similar to a gate turn off (GTO) thyristor but employs PNP bipolar transistors in place of the usual anode P islands. In one modification, the PNP bipolar transistors of the basic device are replaced with P channel, enhancement mode MOSFETs.

7 Claims, 14 Drawing Figures

SEMICONDUCTOR DEVICE

BACKGROUND OF THE INVENTION

1. Field of the Invention

The present invention generally relates to multilayer semiconductor devices, and more particularly to improvements in gate turn off (GTO) thyristor structures to produce a solid state switch having improved characteristics.

2. Description of the Prior Art

FIG. 1 shows a conventional thyristor capable of blocking forward and reverse voltage. These devices have a continuous P layer over the entire anode area. Conventional shorted emitter thyristors capable of blocking only forward voltage have P islands at the anode end. In this case, the anode metal disc shorts the P islands to the adjacent N region at the anode surface as illustrated in FIG. 2. Such a device is asymmetrical, i.e., it cannot block reverse voltage. In both devices the cathode has emitter shorts as shown in FIG. 1. The metal contact to the N emitter region at the cathode end partially overlaps the P base material. The metal contact to the P region is the gate lead, while the cathode is the metal contact to the N region. The purpose of the shorts is to shunt displacement current that would otherwise traverse a vertical path through all junctions and act as a turn on gate pulse. Thus, by offering an easier path around the emitter junctions, undesired internal transistor action is prevented when the device is in its blocking state and a transient change in blocking voltage occurs due to external causes.

FIG. 2 shows a recent improvement wherein an N+ layer is diffused into the N− anode before diffusing in the P+ islands. This N+ layer allows the wafer to be thinner since, in the off state, it stops the depletion layer from spreading further toward the anode. The thinner wafer has a lower on state voltage drop and hence higher efficiency.

Another recent improvement is to create a fast recovery diode at the outer region of the wafer using the P base (gate) diffusion and the N− and N+ regions described. This requires an isolating groove to prevent carriers associated with diode current from diffusing into the four layer device region which would cause the device to turn on when forward blocking voltage is reapplied. FIG. 2 illustrates this structure. Such a fast diode inversely connected across the device is needed in most inverter circuits.

GTO thyristors are similar to conventional shorted emitter thyristors as illustrated in FIG. 2. Current is put into the P base via the gate and holes flow from the gate to the N cathode. This causes electrons to flow from the N emitters into the base. Some of these electrons, in fact more than half of them, diffuse into the N− layer above the base. This causes electrons to flow in the anode side N+ region, creating an IR drop adjacent to the P islands. Holes are then emitted by the anode P regions into the N− region and travel toward the cathode. These holes are minority carriers when they are in the N− region. Similarly, electrons emitted by the N cathode emitter into the P base are minority carriers in the P region.

When the holes emitted by the anode P region at J1 shown in FIG. 2 reach the P base region at J2 and subsequently enter the N emitter region at J3, they are equivalent to hole current created by gate input current. Consequently, gate input current is no longer required, and the device is said to be latched on. The equivalent circuit of a conventional shorted emitter GTO is shown in FIG. 3.

Some of the minority carriers recombine with majority carriers enroute. The fraction of the holes emitted by P1+ that reach P2 is called $\alpha_1$. The fraction of the electrons emitted by N2 that reach N1− is $\alpha_2$. When an electron reaches the N side of J2, a different electron immediately moves into the anode P region as a minority carrier. Together, $\alpha_1$ and $\alpha_2$ determine the behavior of the device. The anode current is given by the following equation:

$$I_A = \frac{\alpha_2 I_g + I_d + I_{sc}}{1 - \alpha_1 - \alpha_2},$$

where $I_g$ is the gate current, $I_d$ is the thermally generated diffusion current, and $I_{sc}$ is the space charge current generated in the depletion region of J1. $I_d$ and $I_{sc}$ can be neglected.

In conventional devices, $\alpha_1$ and $\alpha_2$ increase with current. $\alpha_1$ is usually 0.1 to 0.3 since the anode emitted holes must travel a long distance through N1 to reach P2 and many recombine with electrons. $\alpha_2$ is 0.7 to 0.9 since P2 is relatively thin. If current increases enough so that the sum of $\alpha_1$ and $\alpha_2$ reaches 1, $I_A$ is limited only by external components, and the device is said to be on. Such a conventional device can be turned off by applying a negative gate voltage. This causes the gate to intercept holes emitted by the anode P material that otherwise would reach the N2 emitter regions. Electrons are then no longer emitted by the N2 emitter regions, and the device turns off.

The turn off of conventional GTO devices is made more difficult with clamped inductive loads as illustratively shown in FIG. 4. The problem here is that current is forced to continue unabated until the voltage across the device rises to the clamp voltage level, typically 1000 V. Furthermore, for the gate to intercept all holes emitted by the anode P material, the gate must have good access to all the P2 material at the junction J3 of P2 and N2. This requires very small N2 islands and a fine mesh for the gate metallization. Photolithographic methods are required, as with the manufacture of integrated circuits.

It is also desirable to use a low reverse gate voltage during turn off to avoid breaking down the low voltage P2N2 junction. Hence, a reverse gate voltage of no more than a few volts is preferred. For this low voltage to create a sufficient gradient to prevent holes from reaching N2 requires dimensions in the range of 10 to 100 microns for the N2 islands. To accomplish turn off, <100> crystal silicon has been etched with V-grooves to create N emitter islands of small dimensions which are vertically above the P base and can be cut off by a reverse gate voltage. <111> crystal silicon is standard in other applications, however, and is less costly and carriers have better mobility than in <100> crystal silicon. A V-groove etched <100> crystal silicon device is illustrated in FIG. 5. As may be appreciated from this illustration, the gate contact is difficult to make on the etched surface and the emitter land size possible is not as small as may be preferred.

The foregoing and other prior art are disclosed in the following U.S. Pat. Nos.: 3,972,014; 3,979,766; 3,996,601; 4,011,579; 4,032,958; 4,054,893; 4,163,241; 4,190,853; 4,214,255; 4,278,476; 4,286,279 and 4,291,325.

SUMMARY OF THE INVENTION

It is therefore an object of the present invention to make improvements in GTO thyristor structures.

It is another object of the invention to provide a new semiconductor device of the GTO thyristor type having improved turn off characteristics.

The above and other objects of the invention are accomplished by providing a semiconductor device similar to a GTO thyristor but with means for controlling an "effective $\alpha_1$". "Effective $\alpha_1$" is here defined as the hole current reaching P2 from the anode region divided by the total current crossing J2. Effective $\alpha_1$ is controlled by employing PNP islands on the anode side, rather than P islands. These PNP islands are shunted by N material of desired resistivity. The ratio of hole current to total current is controlled by controlling the conduction of the PNP islands relative to the conduction of the shunt N material. The control of the conduction of the PNP anode islands is accomplished by bringing out their middle layers for external control. With the connection to the center layer of the islands a conductor, the islands are controlled as bipolar transistors. With the connection to the center layer of the islands by a conductor with a dielectric layer interposed between the middle layer and the conductor, the PNP islands are controlled as MOSFET transistors.

BRIEF DESCRIPTION OF THE DRAWINGS

The foregoing and other objects, aspects and advantages of the invention will clearly appear from the following detailed description of the invention taken together with the accompanying drawings, in which.

DESCRIPTION OF THE PREFERRED EMBODIMENTS

Figure 6:
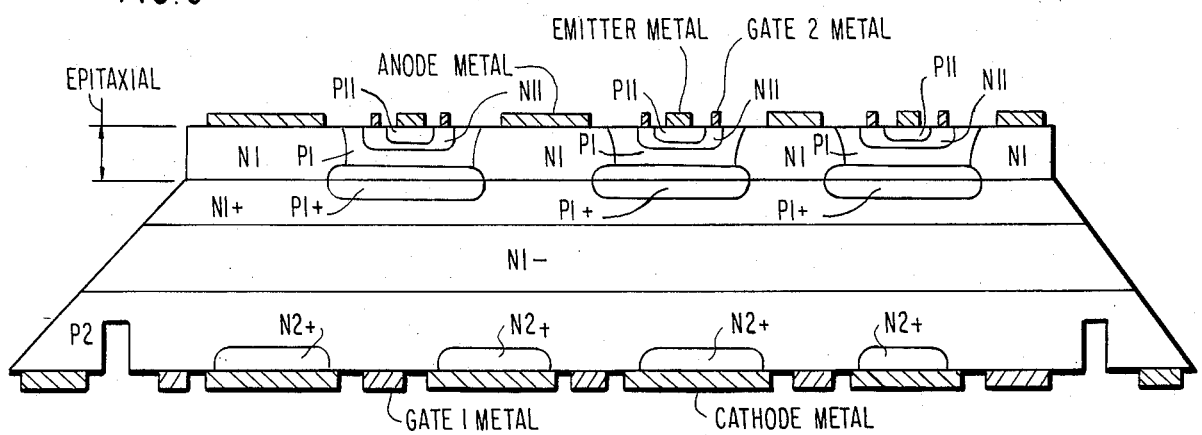
FIG. 6 is a cross-sectional view of an improved semiconductor device according to the invention having PNP islands at the anode end operated as bipolar transistors.

Referring now to the drawings, and more particularly to FIG. 6, the basic form of the invention comprises, in the illustrated embodiment, a body of N− type semiconductor material. A shallow N+ layer at the top or anode face is diffused into the N− body. As used herein, light doping such as $10^{13}$ to $10^{14}/cm^3$ is called N−, medium doping of $10^{15}$ to $10^{18}/cm^3$ is called N, and heavy doping of $10^{19}$ to $10^{20}/cm^3$ is called N+. In FIG. 6, the body of N− type semiconductor material is referenced as N1−. A layer of P type semiconductor material P2 overlies the lower face of the body of semiconductor material N1− and forms the PN junction J2 therewith. A plurality of island regions N2+ of N+ type semiconductor material are formed in the layer P2. Cathode electrodes are formed over the island regions N2+ and in electrical contact therewith. Gate electrodes are formed on the layer P2 in electrical contact therewith and adjacent to the island regions N2+. These gate electrodes are referred to as the first gate or gate one electrodes.

On the top or anode face of the body of semiconductor material N1 are a plurality of island regions P1+ of P+ conductivity type. When an N1+ layer is diffused in ahead of the P1+ islands, the surface can be mechanically and chemically polished to remove the very heavily doped N1+ surface until a level of $10^{18}/cm^3$ is reached. This leaves enough N1 in the wafer to serve as the depletion layer stopper and allows a good quality P1+ layer to be subsequently diffused in. It is desirable for this P1+ layer to be very heavily doped and exhibit a short lifetime for minority carriers to prevent electrons in the underlying N1 layer from diffusing through the P1+ layer. Such a layer is sometimes referred to as a P++ layer. The N1 layer underlying the P1+ layer should exhibit long enough lifetime to permit holes emitted by the P1+ layer above it to readily diffuse through it. N1 will be less than $10^{18}/cm^3$ below the P1+ islands and will rapidly fall off to $10^{13}/cm^3$ below this level, which will allow the desired hole diffusion, since lifetime is a function of doping.

An epitaxial layer is now grown on the anode side of the wafer. It is grown as a P layer since it is contiguous with the P1+ layer and is called P1. Following the growth of this epitaxial layer to approximately 10μ, an N' isolation barrier layer is diffused in. Then the base N11 is diffused in and, at the same time, the barrier is reinforced with additional doping. The last diffusion is the P11 emitter diffusion which can use the same mask as the N11 base to create the double diffused profile, or it can use a smaller opening. The N1 anode contact and the P11 emitter contact are normally common.

Figure 8:
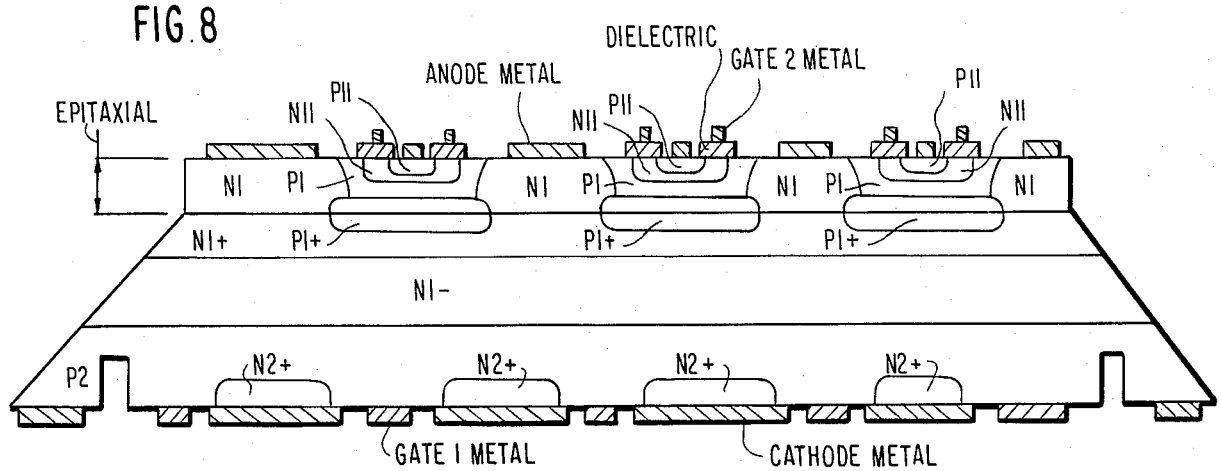
FIG. 8 is a cross-sectional view of an improved semiconductor device according to the invention having PNP islands at the anode end operated as MOSFETs.
Figure 7:
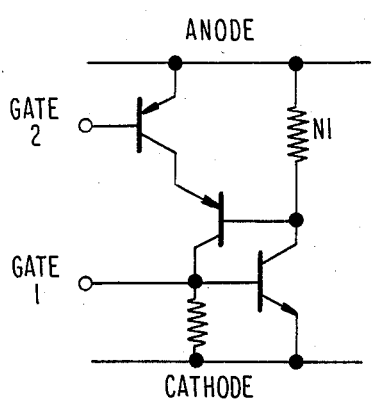
FIG. 7 is a schematic diagram of the equivalent circuit of the improved semiconductor device shown in FIG. 6.
Figure 9:
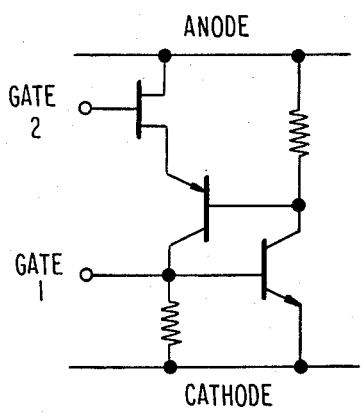
FIG. 9 is a schematic diagram of the equivalent circuit of the improved semiconductor device shown in FIG. 8.

The epitaxial layer device can be operated as either a PNP bipolar transistor or as a P enhancement type power MOSFET. The former is shown in FIG. 6 wherein metal contacts are made directly to the base N11 region. In FIG. 8, an oxide is formed on the N11 region before applying the metal contact thereby forming the MOSFET. These metal contacts are referred to as the second gate or gate two electrodes. In either case, the epitaxial devices serve as a source of majority carrier holes to the P1+ layer. The holes can be cut off quickly since the PNP bipolar transistors have thin layers and fast response, and the MOSFETs are from 10 to 100 times faster than the bipolar transistors. The equivalent circuits for the devices shown in FIGS. 6 and 8 are illustrated in FIGS. 7 and 9, respectively.

In either of the devices shown in FIGS. 6 and 8, there is no danger of electrons diffusing upward through the P1+ layer and complicating operation by creating a four layer latching characteristic because of the short lifetime created in the P1+ layer. However, even a four layer characteristic from N1 to P1+ to N11 to P11 could be turned off via N11. The N1 isolation layer reaches through to the N1+ layer below it and serves as a shunt path around the PNP controlled hole islands.

Figure 1:
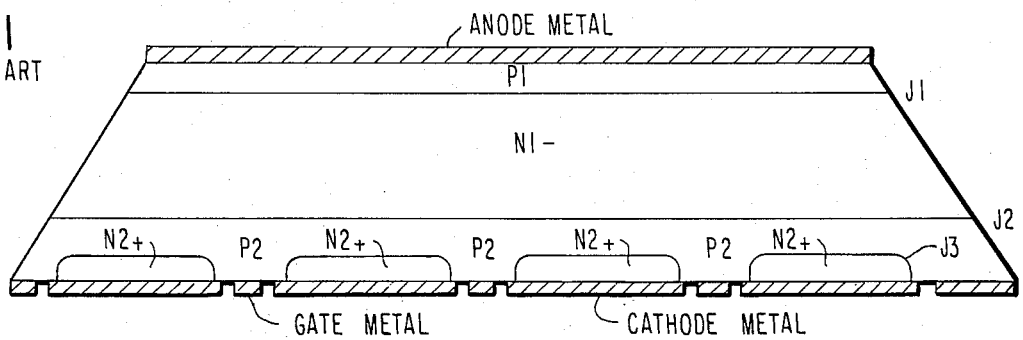
FIG. 1 is a cross-sectional view of a conventional multilayer thyristor device.
Figure 2:
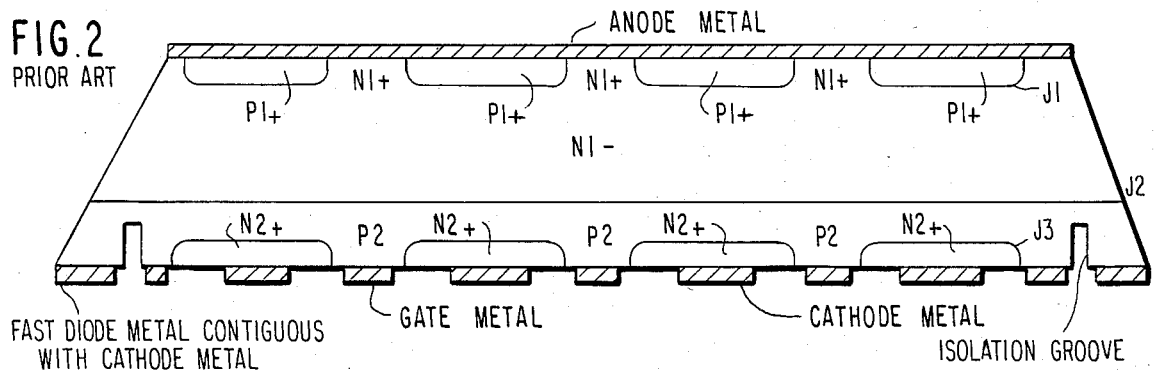
FIG. 2 is a cross-sectional view of a conventional GTO thyristor device having a plurality of anode P islands.
Figure 3:
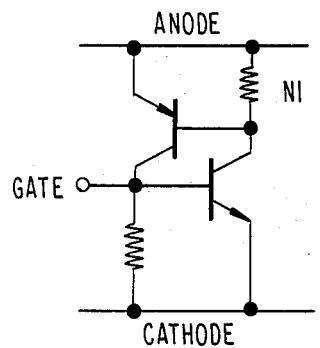
FIG. 3 is a schematic diagram of the equivalent circuit of the conventional GTO thyristor device shown in FIG. 2.
Figure 4:
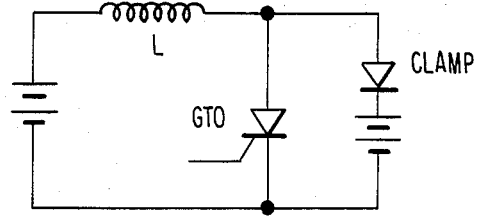
FIG. 4 is a schematic diagram of a simplified circuit having a clamped inductive load and a conventional GTO device.
Figure 5:
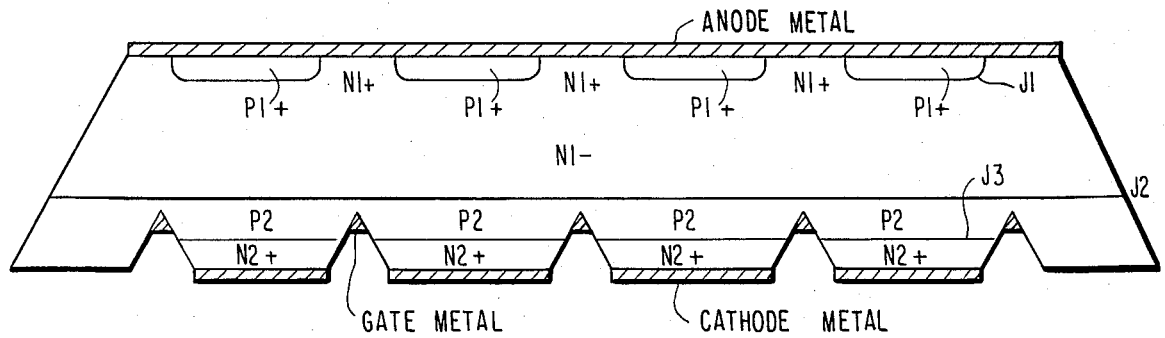
FIG. 5 is a cross-sectional view of a conventional GTO thyristor device made by etching V-grooves in <100> crystal silicon.
Figure 12:
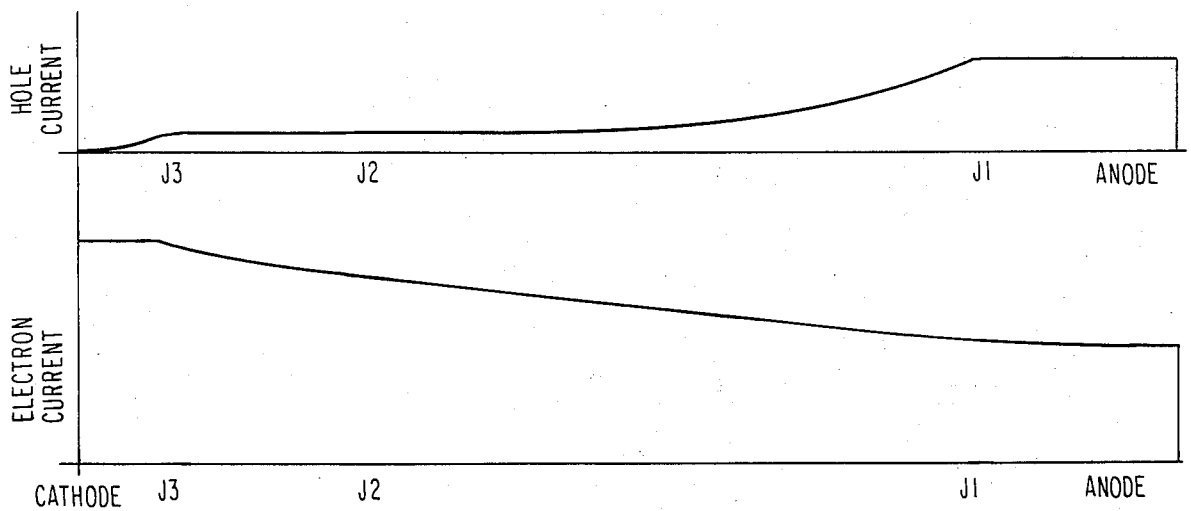
FIG. 12 is a graph illustrating the distribution of hole and electron current, and FIG. 13 the free carrier distribution, in a conventional GTO operating in a clamped inductive circuit and useful in explaining the advantages of the subject invention.
Figure 13:
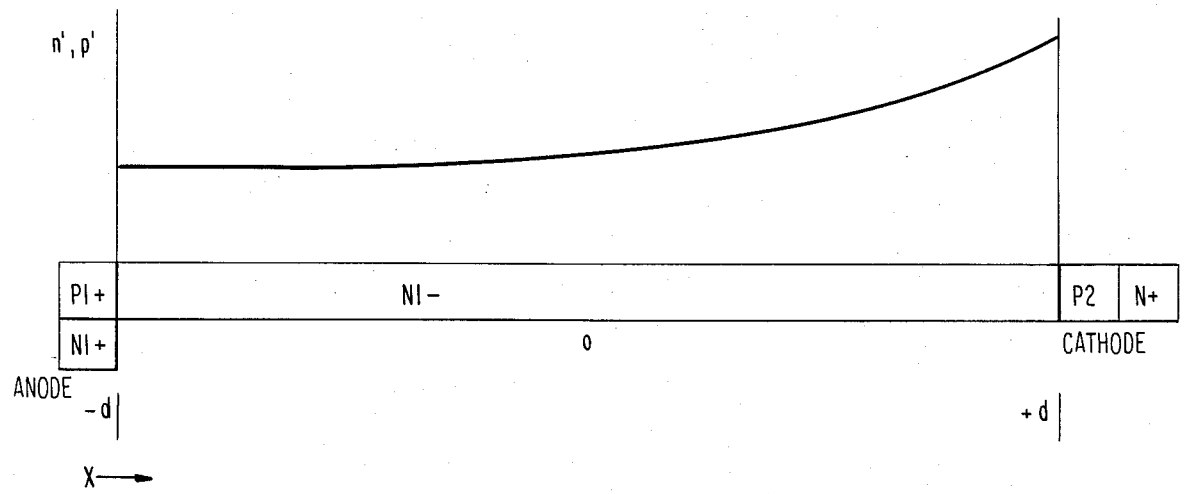

In a conventional GTO operating in a clamped inductive circuit as shown in FIG. 4, the turn off transient proceeds as follows: In the on state, the distribution of hole current is maximum at the anode end and tapers to a lower value at J2 as illustrated in FIG. 12. Holes arriving at J2 are very quickly accelerated through J2 to P2. On the other hand, the electron current distribution is greatest at J3, tapers down slightly through P2 to J2 and then tapers down to J1. From J1 to the anode, the electron current distribution in the P islands falls to zero and, in the shunt N material, remains constant. The hole and electron current distributions are shown in FIG. 12. FIG. 13 shows the free carrier distribution. The distributions of excess electrons and holes in the N1− region are nearly identical, due to charge equality considerations, i.e. coulomb forces. The sum of the electron and hole currents at any cross-section is equal to the load current.

The net hole current in the P2 base is $$I_{P2} = \alpha_1 I_A - I_g,$$

where $I_A$ is the anode current and $I_g$ is the gate current.

The P2 base current required to keep N2/P2/N1 in saturation is $$I_{P2} = (1 - \alpha_2)I_k,$$

where $I_k$ is the cathode current.

If the net hole current is less than the current required to keep N2/P2/N1 in saturation, the device will begin to turn off. This condition is expressed by the following inequality:

$$\alpha_1 I_A - I_g < (1 - \alpha_2)I_k.$$

But since $I_A = I_k + I_g$, then $$-I_g < \frac{(1 - \alpha_2 - \alpha_1)I_A}{\alpha_2}, \text{ or}$$

$$I_g > \frac{(\alpha_2 + \alpha_1 - 1)}{\alpha_2} I_A.$$

Hence, if $\alpha_2$ is 0.9 and $\alpha_1$ is 0.2, a negative gate current greater than 0.1 per unit will begin to turn the device off. However, since the load current can not fall off due to its inductive nature, the J2 depletion region will simply expand to a point where the hole current is large enough to compensate for the loss of holes out of the gate lead. This increases $\alpha_1$ since no holes are lost in being rapidly accelerated through the depletion layer. In general, holes entering the J2 depletion region are swept through rapidly and collide with the lattice numerous times thereby creating hole and electron pairs. If the number exceeds a critical value, avalanche occurs and the device is out of control. The depletion region need not expand all the way to where $\alpha_1$ has increased to compensate for the negative gate current, but it will expand just close to it since some multiplication occurs.

It is important to note that N2 is still emitting electrons and has not been cut off by the reverse gate current. In order to cut off the N2 emitter islands, the reverse gate current must exceed $I_A$, i.e. 1.0.

The hole current profile is important in turning off the conventional device. If this distribution is low and shallow, the depletion layer must expand extensively before $\alpha_1$ increases sufficently to supply the needed holes to P2. If the reverse gate current is 0.3, the depletion will have to expand back to where $\alpha_1$ is 0.4 before enough holes are supplied. Typically, this many holes are not being emitted by the P1 islands. The anode to cathode voltage of the device is determined by the width of the depletion region, and, if the width results in a voltage greater than the external circuit voltage, the current will begin to decay at a rate determined by the difference in these voltages divided by the stray inductance in the external circuit. If the external circuit voltage is high enough and $\alpha_1 I_A - I_g$ is large enough to supply the needed holes to P2, the device will stall with a wide depletion region but will not turn off resulting in thermal destruction of the device.

In a conventional GTO, the hole current profile is not easily predictable. Furthermore, a low profile is highly undesirable since the forward voltage drop of the device increases if the hole to electron ratio is not sufficient for conductivity modulation. Lifetime shortening, or wide N1− regions, or low $\alpha_1$ via small P1 total area all result in a shallow profile and high forward voltage drop.

The spreading of the depletion region is a relatively slow phenomenon. The store of holes is consumed as the depletion region spreads, and the spreading rate is determined by the difference in $\alpha_1$ at a given point and the $\alpha_1$ required. For example, if an $\alpha_1$ of 0.4 is required and $\alpha_1$ is 0.3 at a particular distance, the store of holes is consumed at a rate of less than 0.1 since there is always some collision multiplication through J2.

By contrast, with control of hole emission provided by my invention, the switching transient is rapid and sure without the stall mechanism present. If the same reverse gate current is applied as with a conventional GTO, the depletion layer will expand as before. However, with the supply of holes cut off at the anode end, two things will occur to speed up the process. Recombination in the N2 region will diminish the pool of free holes and electrons in this region since they are not being replenished as with the conventional GTO. The second thing is the device current, which has not abated, conveys the existing holes toward the depletion region and will rapidly sweep them all out even if the depletion region were not expanding.

The principle of charge equality is that in any region containing free minority carriers, an equal number of free majority carriers will exist. When the source of anode holes is cut off, a hole density gradient will develop and a diffusion current proportional to this gradient will prevent an abrupt spatial change in hole density. The hole density in the entire N1− region will decline.

If the same reverse gate current of 0.3 is used, and if an additional 0.1 hole current is required to keep the N2 emitters active and supplying a cathode current of 0.7 for a total of 1.0 as required, the current crossing J2 will be a hole current of 0.4 and an electron current of 0.6, 0.1 being consumed in recombination in P2. Since no new holes are being emitted, the pool of holes in the queue between J2 and J1 will decline at a rate of 0.4 of load current, and since the current in the anode region is 1.0 electron current and only 0.6 electron current is crossing J2, the pool of free electrons in the N1− region is also being consumed at a rate of 0.4 of the load current. Thus, the queue of carriers ahead of the advancing depletion region is being thinned at a total rate of 0.8, whereas in a conventional GTO the carriers are being thinned at a rate of $-I_g + \alpha_1 \ I_A - I_{rE} = -0.3 + 0.3 - 0.1$, or a net of $-0.1$, ahead of the depletion region.

In a conventional GTO, the switching is due to a low rate of advancement of the depletion region into the anode region of the hole current profile, whereas in my new device no holes are being omitted and the queue is thinning very rapidly, requiring the depletion layer to spread very rapidly to consume enough holes to satisfy the need for $\alpha_1$. The further the depletion region spreads, the faster it must spread since the hole concentration is thinner and thinner. This is the ideal situation for a high power switch, that is, less time is spent at higher voltage than at lower voltage. The situation with the conventional GTO is exactly the opposite. As the depletion layer spreads, it enters the region of greater hole current density and it spreads ever more slowly and can even stall and fail. In my new switch, by reducing $\alpha_1$ to zero the switch can not stall even if no reverse gate current at P2 were used at all.

Figure 14:
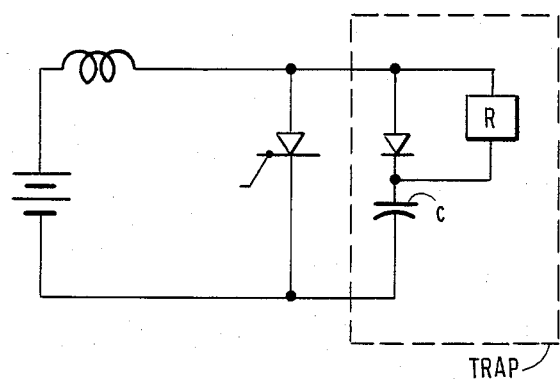
FIG. 14 is a schematic diagram of a trap used in a conventional GTO.

Conventional GTO's employ a diode, capacitor, resistor trap, as shown in FIG. 14, which accepts current as the device voltage rises. This represents a substantial power loss, but if c is large enough, $I_A$ is substantially reduced in the device; hence, $\alpha_1 \ I_A$ hole current is greatly reduced. The N2 emitters can even be cut off by the reverse gate current of $-0.3$ or less. However, it is an object of the invention to greatly reduce the clamp size. Long lifetime can be used in the N1− region which reduces forward on state drop, and the density of holes in N1− can be higher also resulting in lower forward drop. The device according to my invention can switch off at a voltage closer to its off state blocking voltage since the density of holes during switch off does not increase close to the P1+ islands, but actually decreases. To understand the significance of thinning free carriers ahead of the expanding depletion region, a typical power semiconductor will store approximately 1 μcolumb of charge per ampere in the on state. Therefore, when the thinning is at a rate of rated current, the free carriers will be gone in 1 μsec. Thus, there is no need to shorten lifetime since the carriers will be swept out by load current. Another advantage to thinning out of the carriers is that a smaller total number will be swept through the wide high voltage depletion region which not only is ideal in minimizing losses, but reduces the number of electron hole pairs generated by collisions with the lattice.

The expanding depletion layer consumes holes at the same time load current is thinning them, so that the combined effect is to reduce the switching time to well under one μsec.

Figure 10:
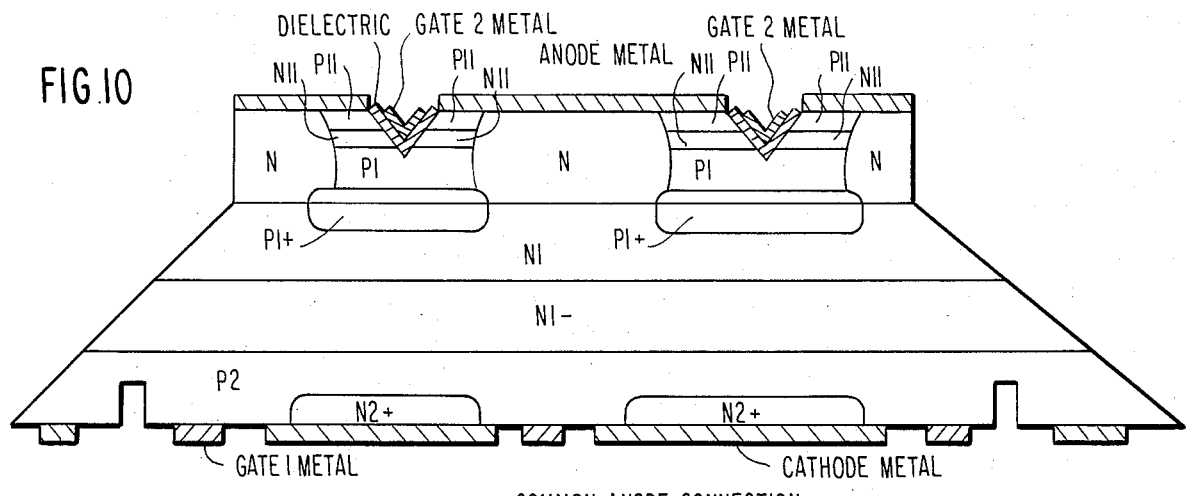
FIG. 10 is a cross-sectional view of a modification of the improved semiconductor device according to the invention similar to the embodiment shown in FIG. 8 wherein the MOSFETs are V groove type and the cathode gate is also a MOSFET.
Figure 11:
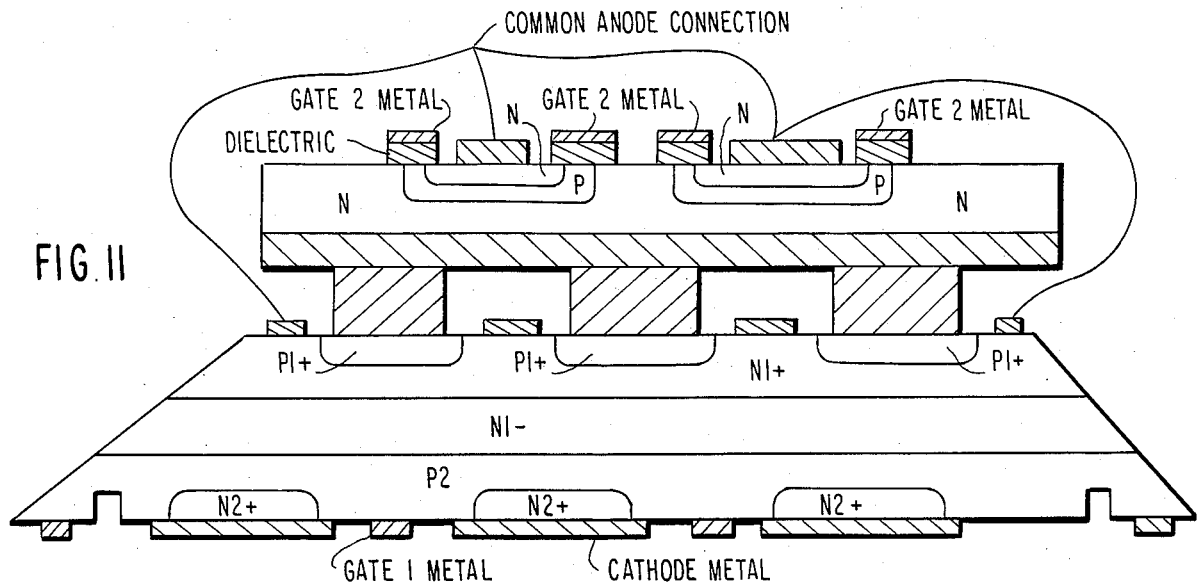
FIG. 11 is a cross-sectional view of yet another modification of the improved semiconductor device according to the invention wherein the PNP islands of the device are replaced by metallic contacts to the P1+ islands allowing the use of high mobility N type enhancement mode power MOSFETs to control the turn off of the device.

A further modification of the invention is shown in FIG. 10. This structure is essentially the same as that of FIG. 8 except that V type power MOSFETs are used. In yet another modification, separate metallic contact to the P1+ islands is made with an NPN, N enhancement type wafer positioned above the substrate as shown in FIG. 11. In this case, a separate contact to the N1+ region is made in common with the source of the NPN, N enhancement type wafer.

In general it is possible to interchange N and P layers throughout the several embodiments to allow the use of NPN, N enhancement MOSFETs which have higher mobility. Of course, if this is done, the anode and cathode are also then reversed. In all cases the power MOSFETs or bipolar transistors used to control $\alpha_1$ can be low voltage devices with low forward voltage drop and fast response even though the GTO may operate at several thousand volts.

I claim:

1. A semiconductor device comprising:
    a body of semiconductor material of a first conductivity type;
    a layer of semiconductor material of a second conductivity type on one face of said body of semiconductor material and forming a PN junction therewith;
    at least one island region of said first conductivity type in said layer of semiconductor material;
    a cathode electrode in electrical contact with said island region in said layer of semiconductor material;
    a first gate electrode in electrical contact with said layer of semiconductor material adjacent said island region;
    at least a first island region of said second conductivity type in said body of semiconductor material on a face opposite said one face;
    a second island region of said first conductivity type within said first island region of said second conductivity type;
    a third island region of said second conductivity type within said second island region of said first conductivity type, said first, second and third island regions forming a bipolar transistor;
    an anode electrode in electrical contact with said body of semiconductor material adjacent said first island region;
    an emitter electrode electrically common with said anode electrode and in electrical contact with said third island region of said second conductivity type; and
    a second gate electrode in electrical contact with said second island region of said first conductivity type.

2. A semiconductor device comprising:
    a body of semiconductor material of a first conductivity type;
    a layer of semiconductor material of a second conductivity type on one face of said body of semiconductor material and forming a PN junction therewith;
    at least one island region of said first conductivity type in said layer of semiconductor material;

a cathode electrode in electrical contact with said island region in said layer of semiconductor material;

a first gate electrode in electrical contact with said layer of semiconductor material adjacent said island region;

at least a first island region of said second conductivity type in said body of semiconductor material on a face opposite said one face;

a second island region of said first conductivity type within said first island region of said second conductivity type;

a third island region of said second conductivity type within said second island region of said first conductivity type, said first, second and third island regions forming a MOSFET;

an anode electrode in electrical contact with said body of semiconductor material adjacent said first island region;

a source electrode electrically common with said anode electrode and in electrical contact with said third island region of said second conductivity type; and a second gate electrode separated from said second island region of said first conductivity type by a dielectric.

3. A semiconductor device comprising:

a body of semiconductor material of a first conductivity type;

a layer of semiconductor material of a second conductivity type on one face of said body of semiconductor material and forming a PN junction therewith;

at least one island region of said first conductivity type in said layer of semiconductor material;

a cathode electrode in electrical contact with said island region in said layer of semiconductor material;

a first gate electrode in electrical contact with said layer of semiconductor material adjacent said island region;

at least a first diffusion region of said second conductivity type in said body of semiconductor material on a face opposite said one face;

a second diffusion region of said first conductivity type over said first diffusion region of said second conductivity type;

a third diffusion region of said second conductivity type over said second diffusion region of said first conductivity type, said second and third diffusion regions being divided in half by a V groove extending into said first diffusion region;

an anode electrode in electrical contact with said body of semiconductor material and said third diffusion region;

a dielectric formed within said V groove; and a second gate electrode separated from said second diffusion region of said first conductivity type by said dielectric.

4. A semiconductor device as recited in claims 1, 2 or 3 wherein said semiconductor of a first conductivity type is an N type semiconductor and said semiconductor of a second conductivity type is a P type semiconductor.

5. A semiconductor device as recited in claims 1, 2 or 3 wherein said first, second and third regions are formed in an epitaxial layer grown on the face opposite said one face of said body of semiconductor material.

6. A semiconductor device comprising:

a first body of semiconductor material of a first conductivity type;

a layer of semiconductor material of a second conductivity type on one face of said first body of semiconductor material and forming a PN junction therewith;

at least one island region of said first conductivity type in said layer of semiconductor material;

a cathode electrode in electrical contact with said island region in said layer of semiconductor material;

a first gate electrode in electrical contact with said layer of semiconductor material adjacent said island region;

at least a first island region of said second conductivity type in said first body of semiconductor material on a face opposite said one face;

a second body of semiconductor material of said first conductivity type;

at least a second island region of said second conductivity type on one face of said second body of semiconductor material;

a third island region of said first conductivity type within said second island region of said second conductivity type;

an electrode on said face opposite said one face of said second body of semiconductor material and in electrical contact with said first island region of second conductivity type in said first body of semiconductor material;

an oxide layer formed on said second island region in said second body of semiconductor material;

a second gate electrode formed over said oxide layer; and an anode electrode in electrical contact with said first body of semiconductor material adjacent said first island region of said second conductivity type and also in electrical contact with said third island region in said second body of semiconductor material.

7. A semiconductor device as recited in claims 1, 2, 3 or 6 wherein an isolating groove is formed in said layer of semiconductor material of said second conductivity type adjacent a peripheral edge thereof to define a fast recovery diode formed by said PN junction.

* * * * *